United States Patent [19]
Duté

[11] 3,961,200
[45] June 1, 1976

[54] APPARATUS FOR CONSTRUCTING CONTROL CIRCUITS HAVING RELAY CIRCUIT FUNCTIONAL CHARACTERISTICS

[76] Inventor: John C Duté, 455 Hilldale Drive, Ann Arbor, Mich. 48105

[22] Filed: Sept. 6, 1973

[21] Appl. No.: 394,930

[52] U.S. Cl. .......................... 307/112; 340/172.5; 317/101 CE; 307/203
[51] Int. Cl.² ..................................... H03K 19/12
[58] Field of Search .............. 317/101 CE; 307/112, 307/113, 203, 207, 208, 218, 293; 340/166 R, 147 R, 172.5; 324/28

[56] References Cited
UNITED STATES PATENTS

| | | | |
|---|---|---|---|
| 3,036,222 | 5/1962 | Witt | 307/203 X |
| 3,774,051 | 11/1973 | Chandler, Jr. | 307/203 |
| 3,890,512 | 12/1973 | Kumakawa et al. | 307/203 |

*Primary Examiner*—Herman J. Hohauser
*Attorney, Agent, or Firm*—Thomas N. Young

[57] ABSTRACT

Plug-in circuit modules and a prewired panel are provided for constructing fully functional relay-type control circuits according to ladder diagram conventions. Plug-in modules include input converters for interfacing external switch devices to the relay equivalent logic circuitry, output converter modules for interfacing the logic circuitry to external load devices, relay contact equivalent modules, relay coil equivalent modules, and wire equivalent modules which can be used to effect certain circuit interconnections. The panel is prewired to interconnect module plug-in positions such that insertion of modules produces continuous electrical circuits across the panel much like a ladder diagram. Contact equivalent modules can be addressed to effectively link them to selected coil equivalent modules to establish a master-slave relationship. Synchronous interrogation means are provided fo systematically comparing the status of the relay contact equivalent modules to the coil equivalent modules to which they are slaved and to generate update signals as necessary to effect a change in status, thus, to produce the functional equivalent of the electromagnetic interconnection between hard-wired nonsolid-state relay-type devices. The circuit is easily disassembled and changed in accordance with the desires of the user.

23 Claims, 10 Drawing Figures

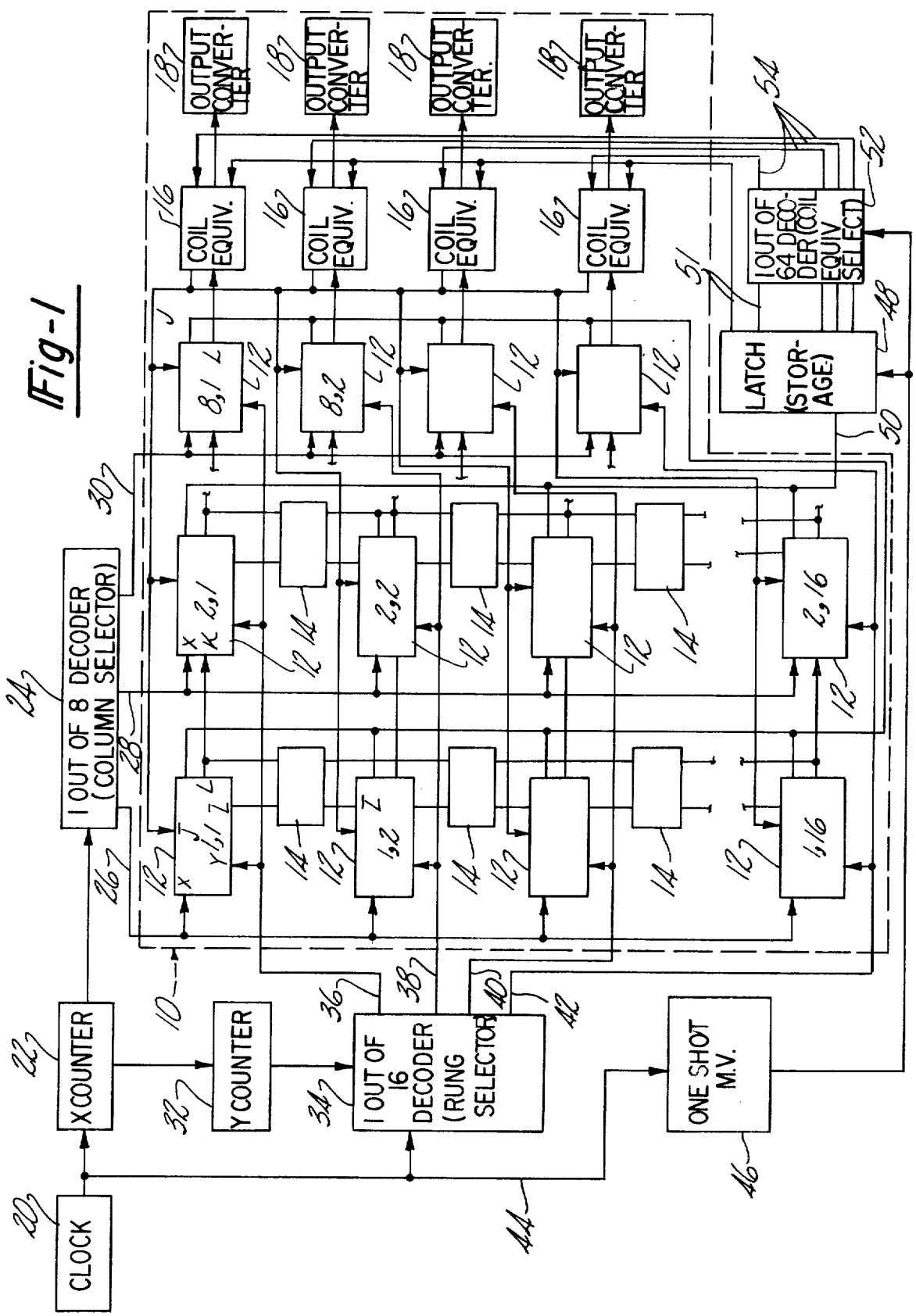

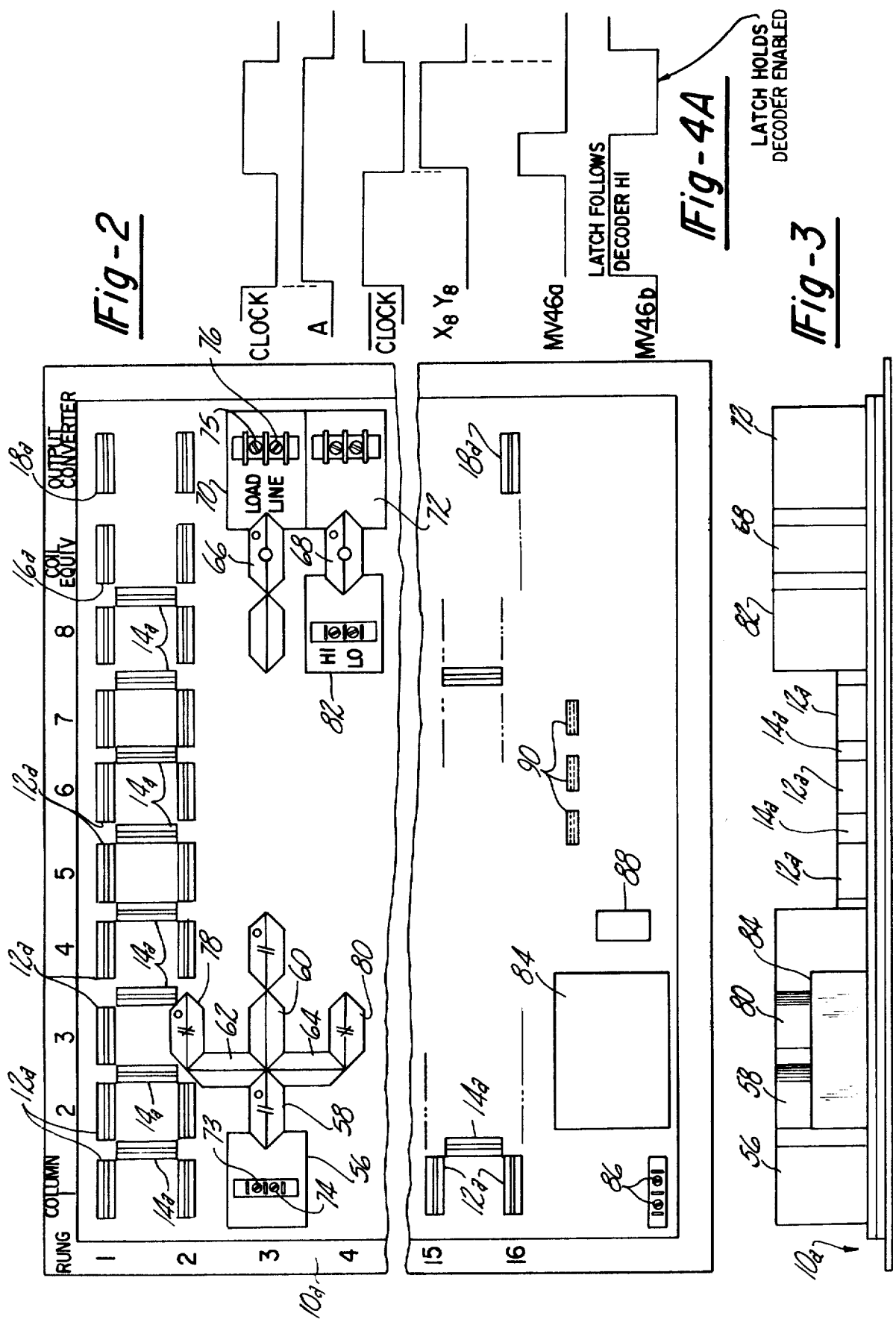

| CONTACT EQUIVALENT TYPE | DEGENERIZED CONDITION L=0 | ENERGIZED CONDITION L=1 |
|---|---|---|
| NORMALLY CLOSED CONTACTS H=0 | | |
| | CONDUCTING J=1 | NOT CONDUCTING J=0 |
| NORMALLY OPEN CONTACTS H=1 | | |
| | NOT CONDUCTING J=0 | CONDUCTING J=1 |

APPARATUS FOR CONSTRUCTING CONTROL CIRCUITS HAVING RELAY CIRCUIT FUNCTIONAL CHARACTERISTICS

This invention relates to apparatus for facilitating the construction of control circuits having relay circuit functional characteristics.

BACKGROUND OF THE INVENTION

It is well known that control circuits including such elements as switches, motors, transducers, and other devices having interrelated functions, operational sequences, and so forth may often be implemented using relay devices. Simply defined, a relay is a device having a control element, typically in the form of a coil, and a controlled element, typically in the form of an armature and a set of contacts. The state of the contacts, either opened or closed, is dependent upon the so-called "normal" condition of the contacts and the presence or absence of current through the coil. Accordingly, it is possible to accomplish a wide variety of control functions, operating sequences, and so forth using relays in combinations of various complexity.

The implementation of a relay circuit is in itself often a difficult step in that the physical location of components often rises to complex and confusing patterns of wires, cables, and other forms of conductors between such elements. Accordingly, difficulty arises in terms of space conservation and also in terms of troubleshooting operations and repair functions. The understandability of relay circuits has been greatly improved by use of so-called "ladder diagrams". This is essentially a device for systematizing the relay-type control circuit using drafting conventions so as to aid the designer and others who are involved with the operation of a control circuit to understand the wiring arrangement and the functional relationships between parts. Ladder diagrams do not, however, eliminate the basic problems in the actual implementation of relay-type control circuits using conventional relay devices.

Control circuits may also be implemented using solid state logic devices, such as gates, flip-flops, and inverters, thus to eliminate most of the space conservation problem associated with devices, such as solenoid-armature type relays. Small, low-power, solid-state devices are also often more easily interconnected than larger hardwired relay devices. Logic circuits, however, require a high degree of technical expertise for functional understanding including, for example, a mastery of Boolean arithmetic principles. In addition, logic circuitry is only utilized to greatest advantage when it is reduced to circuit board state, a step which typically freezes the circuit design and eliminates the possibility for substantial expansion or modification of the control circuit.

BRIEF SUMMARY OF THE INVENTION

The present invention provides an apparatus for constructing a wide variety of both simple and complex control circuits in such a fashion as to afford to the user the simplicity and graphic understandability of relay circuit ladder diagrams while at the same time providing reliability, handling ease, low power consumption, and space conservation advantages of solid-state logic. Moreover, the present invention permits rapid construction, modification, and disassembly of totally functional control circuits of widely varying degrees of complexity with minimum requirement for actual interconnection of wires, cables, and other conductors and without requirement for an understanding of sphisticated logic circuit design principles or Boolean arithmetic.

In general, these objectives are accomplished by means of an apparatus including solid-state plug-in modular devices capable of providing the functional equivalents of the various elements of a relay-type control circuit; e.g., coils, contacts, conductors, and so forth. The apparatus further comprises means, such as a plug-in panel, for receiving the plug-in modular devices in various patterns so as to facilitate the systematic construction of control circuitry, the panel being prewired to the degree necessary to provide, in a systematic fashion, the master-slave relationship which must exist between the various elements of a relay type control circuit. To construct a circuit, one simply plugs the solid-state logic modules representing the relay elements into the board and interfaces the external devices, such as switches and motors, to the logic circuitry. The user, thus, constructs a circuit which is a hybrid of external, conventional electronic components and internal solid-state control logic components and which is the full functional equivalent of a relay control circuit using conventional coil-contacts relay devices. The panel and the plug-in modular devices provide the reliability and space conservation of solid-state and, at the same time, further provide a graphic understanding to the user of the nature of the circuit which is constructed.

In an illustrative form of the invention hereinafter described in detail, a plug-in panel is provided to receive in various patterns and arrangements, a plurality of plug-in modular devices including devices which provide the functional equivalents of relay coils and relay contacts as well as input and output interfacing devices which facilitate electrical connections to external components, such as transducers, motors, and so forth. Address means, hereinafter described in greater detail, are provided for selectively interrelating the elements representing the coils and the elements representing the contacts of a relay thereby to establish the necessary masterslave relationships which are implicit in a relay control circuit. In addition, a system of periodic interrogation is estabished whereby all elements are repetitiously reviewed or interrogated to determine whether the proper contact status is represented and, to the extent it is not, update signals are generated and transmitted such that the overall internal condition of the control circuit responds to changing external conditions in exactly the same fashion as would a hardwired prior art relay control circuit.

According to a preferred embodiment of the invention hereinafter described in greater detail, the modular devices assume a specific geometric configuration so as to interfit with one another in various horizontal and vertical orientations. In addition, the contact equivalent modules include simple and easily-operated address selection means so as to effect the desired relations thereof to selected coil equivalents. Various additonal features and advantages of the present invention will be understood upon reading of the following specification which describes an illustrative embodiment of the invention in detail.

BRIEF DESCRIPTION OF THE DRAWINGS

FIG. 1 is a block diagram of a control portion of an illustrative embodiment of the invention indicating basic logical interconnections between plug-in element positions and the interrogation and update system.

FIG. 2 is a plan view of a plug-in panel having a plurality of plug-in modular devices disposed thereon in a randomly selected illustrative pattern;

FIG. 3 is an end view of the panel of FIG. 2;

DEFINITIONS

Figure 4:
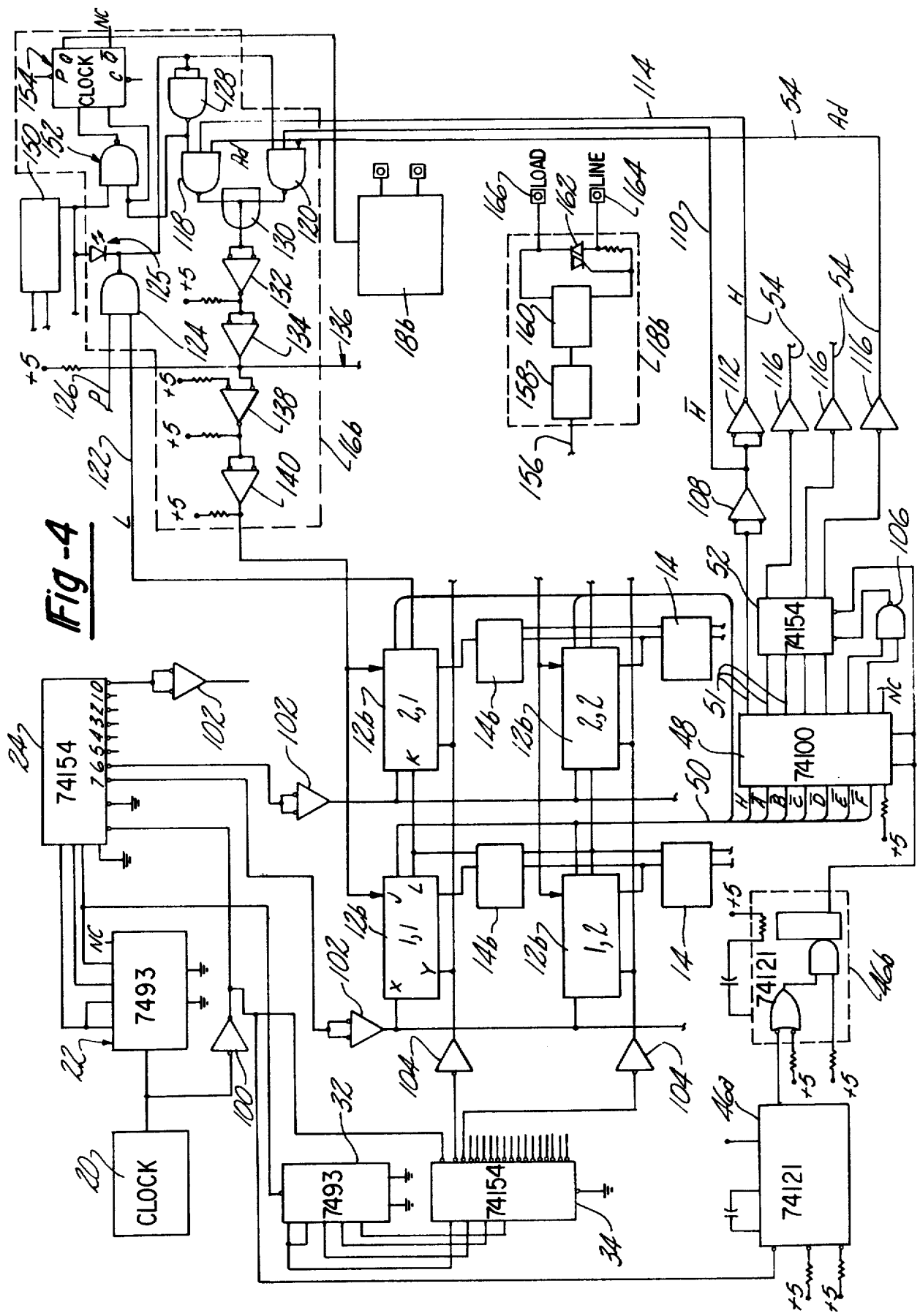
FIG. 4 is a schematic circuit diagram of the illustrative embodiment of the invention illustrating the address selection system and element interconnection in detail.

In the following specifications these definitions will be employed:

A. Contact Equivalent — A modular device which represents the contact portion of a relay and is capable of producing the functional equivalence thereof; is capable of assuming an indentifying address so as to be slaved to a particular relay coil or "coil equivalent";

B. Coil Equivalent — A modular device which represents the solenoid portion of a relay, provices the functional equivalence thereof and controls the status of one or more contact equivalents; this device is capable of assuming either of two conditions corresponding to conducting and nonconducting states;

C. Wire Equivalent — A modular device representing a passive conductor or wire link between circuit components and, although it contains active elements, produces the functional equivalence of a passive wire; this device may be plugged into the panel in a variety of orientations, the external contacts or terminals thereof being such as to utilize the proper internal portions thereof in accordance with the orientation of the device on the panel;

D. Input Converter — A modular device to convert external power to logic level providing an interface with external control system elements such as switches and including terminals for attaching input wires from such switches;

E. Output Converter — A modular device providing interfacing with external system components and, in particular, accomplishing a power level increase between the logic portion of the control system and the external controlled element.

DETAILED DESCRIPTION OF THE ILLUSTRATIVE EMBODIMENT

FIG. 1 — CONTROL System Block Diagram

The block diagram of FIG. 1 includes an area 10 defined by a broken line and representing a prewired panel defining discrete positions 12, 14, 16, and 18 for plug-in modular devices used in the construction of control circuits according to relay circuit ladder diagram conventions. The block diagram of FIG. 1 further illustrates the interconnections between those positions and the controller means whereby the master-slave relationship between certain of the modular devices is established and maintained.

More specifically, the panel 10 is shown to comprise eight columns of prewired positions 12 capable of receiving either an input converter module, a contact equivalent module, or a wire equivalent module in accordance with which of these elements is involved in the construction of the desired ladder diagram. In the specific example of FIG. 1, each column is subdivided into sixteen discrete positions 12 so as to define sixteen uniformly vertically spaced rungs. The discontinuous wiring between positions 12 in a given rung is such as to permit the selective construction of continuous electrical circuits extending along the rungs for varying horizontal lengths by the proper insertion of the aforementioned modules into the positons 12, 14, 16, and 18.

Slightly offset in the columns and midway between the rungs are additional prewired positions 14 which can only accommodate wire equivalent modules to effect branching or "ORing" between the continuous circuits of spaced rungs. Accordingly, one rung circuit may join into another rung circuit at some point or, one rung circuit may branch out into two or more other rung circuits as desired. Either way, "ORing" or branching is accomplished by inserting wire equivalent modules in the positions 14.

Panel 10 further includes a single column of prewired positions 16 which only accommodate coil equivalent modules used in the construction of the ladder circuit. The column of positions 16 is immediately to the right of the eighth or last column of positions 12, the convention observed being the location of all coil equivalent modules to the right of the contact equivalent modules in each rung of the ladder circuit no matter how that rung is constructed or what elements it contains. It will be understood that this convention is essentially one of convenience and other conventions could be observed.

Finally, panel portion 10 includes a single column of positions 18 which are prewired to receive output converter modules. These modules allow a rung circuit to be effectively extended externally of the panel 10 thereby to include an external and often relatively high-power consuming device, such as a motor. Accordingly, the motor is rendered operative only when the continuous electrical rung circuit of which it is effectively a part is conductive. Circuit conductivity is, of course, a function of the status of the contact equivalent modules in that rung circuit.

From the foregoing it can be seen that a rung might typically be employed to construct a continuous electrical circuit having both internal and external elements simply by plugging the proper modules into the positions 12, 14, 16, and 18 and connecting the external elements into the circuit by way of the handy screw terminals on the input and output modules. A continuous electrical circuit may extend fully or only partially across a given rung; it may or may not be electrically connected to another rung via a position 14. The conductivity of any continuous electrical rung circuit is determined by the open and closed conditions of the contact elements in that circuit, including the external switch, if any, connected into the circuit via an input converter module. If the rung circuit includes a coil equivalent module, the conductivity of the rung circuit, thus, controls the contact status and, hence, conductivity, of other rung circuits on the panel 10. If the rung circuit includes an output converter and if that converter is connected to an external device, such as a motor, the motor becomes energized whenever the rung circuit is conductive. It should be noted that the logic level voltages of the rung circuit are not typically applied directly to the external load device, but operate to close an external, high-power circuit to the load device.

Still further by way of example, a very simple rung circuit might include an external switch connected to an input converter module in a position 12, a wire equivalent module in the next position 12 in that rung, a coil equivalent module in the position 16 in that rung, and an output converter module in position 18. The same circuit might include a branch to a lower rung by suitable location of a wire equivalent module in a position 14 adjacent the wire equivalent in position 12 and a completion of as many additional ladder diagram rungs as might be desired. The possibility of constructing a wide variety of ladder diagram circuits usisng only the aforedefined modules will be apparent to those skilled in the electronic circuit synthesis art.

Once the modules representing the various portions of the desired ladder circuit are properly plugged into the positions 12, 14, 16, and 18 of panel 10, it is essential that the condition of the contact equivalent modules in the circuit be continuoulsy kept in agreement with the conductive or nonconductive state of the coil equivalent modules to which they are selectively slaved so as to functionally follow the workings of an actual hardwired relay-type ladder circuit. To accomplish this, controller means are provided whereby the positions 12 are systematically interrogated, in sequence referred to the coil equivalent modules which control the status thereof, and "update" signals generated as necessary for application back to the contact equivalent modules in the positions 12. It will be noted that only positions 12 are systematically interrogated, there being no need to update or otherwise modify the wire equivalent modules in positions 14.

The controller system comprises a clodk 20 for producing a periodic pulse train which is connected into a fourbit, binary counter 22. The outputs of counter 22 are connected in parallel to a decoder 24 having eight output lines of which only lines 26, 28, and 30 are shown. These lines are energized in sequence to periodically apply what might be thought of as a "half-select" signal to each of the columns of positions 12 starting with the righthandmost column and proceeding across from right to left in a repetitious and continuous fashion. The selection signals are applied to all column positions 12, whether or not occupied by a module.

The output from the most significant bit position of counter 22 is connected to the input of a second counter 32 which is similar to counter 22. Four coded output lines from counter 32 are connected into the decoder 34 for periodically producing half-select signals for sequential application to the rungs via the sixteen output lines of which only lines 36, 38, 40, and 42 are shown. From this connection, it will be apparent to those skilled in the electronics art that decoder 24 energizes all eight output lines 26, 28, and 30 for each output line energization of decoder 34. Thus, a conicidence of half-select signals appears cyclically at each of the positions 12 beginning with the position 1,1, and progressing to positions 8,1, 7,1, 6,1, 5,1, 4,1, 3,1, 2,1, 1,1, and 8,2 in that order. The coincidence of half-select signals continues on through the entire array of positions 12 ending at position 1,16 in the bottom rung in the lefthandmost row.

As each position 12 receives a coincidence of two half-select signals from decoders 24 and 34, an address signal from a contact equivalent module in the selected position 12 is generated and transmitted to the coil equivalent module in a position 16. The particular coil equivalent module so addressed is that to which the coincidently selected contact equivalent module is slaved in the relay sense. Thus, it will be understood that the address signal which is produced by the selected contact equivalent module is not a function of the position 12 in the array of FIG. 1 where that module is disposed but rather is an indicator of the association between that contact equivalent module and a given coil equivalent module in a position 16. A contact equivalent module in rung number twelve on panel 10 may address the coil equivalent module in rung number three of panel 10, for example. The address represents only the rung in which the master coil equivalent resides. Two or more contact equivalents may be slaved to a single coil equivalent module. The address signal also indicates the "normal " circuit configuration for that contact equivalent module, either open or closed, as will be hereinafter described in greater detail.

Address signal timing at the coil equivalents is accomplished by applying the periodic clock signal pulses by way of line 44 to a pair of one-shot multivibrators, both represented by block 46, having output signals of fixed duration. The outputs of the multivibrators 46 are connected to a latch circuit 48 and to a decoder 52. The seven-bit address signal is applied to the latch circuit 48 by way of bus 50. Latch circuit 48 is a prior art device capable of storing the address signal combination for a required period irrespective of the lesser duration of the address signal combination itself. This ensures that no errors are generated during address signal transitions as will be apparent to those skilled in the art. The output of the latch circuit 48 appears on output lines 51 and is a complete identifier of the relationship between the contact equivalent in the selected position 12 and the coil equivalent position 16 to which it is slaved. The last bit of the seven-bit signal identifies the normal configuration of the contact equivalent module, either open or closed. The signal combination on output lines 51 is applied to decoder 52 which selects for energization one of the output lines 54 thereby to select a particular coil equivalent module. The coil equivalent in the selected position 16 then responds to a combination of input logic-level signals representing (a) the normal configuration of the contact equivalent module, and (b) the conductive or nonconductive condition of the coil equivalent according to the current carrying capability of the rung circuit within which the coil equivalent module is disposed. From this combination, the controller circuitry determines whether or not to generate an update signal, hereinafter referred to as a J signal, for application to the selected contact equivalent module. As will be apparent from a review of the table of FIG. 9, the J signal goes high ($J = 1$) only when the contact equivalent module is to represent the current carrying or conducting condition.

In summary, it will be apparent that the arrangement of FIG. 1 is employed, along with selected combinations of the five module types previously defined, to construct control circuits according to relay ladder diagram conventions. Once the contact equivalents are properly located in the positions 12 and the coil equivalents are properly located in the positions 16, the controller produces a continuous interrogation cycle to systematically maintain all of the contact equivalent modules in the position 12 in the electrical circuit conditions which are dictated by the conditions of the coil equivalent modules in the positions 16.

FIGS. 2 & 3 — The Plug-In Panel Board

In FIGS. 2 and 3 there is shown a relatively thin and substantially rectangular rigid circuit board 10a which is prewired according to the system previously described with reference to FIG. 1 and carrying sockets 12a, 14a, 16a, and 18a corresponding to the positions 12, 14, 16, and 18 described with reference to FIG. 1. Accordingly, the sockets 12a are wired to receive input converter modules such as module 56 illustrated in the upper lefthand corner of FIG. 2, contact equivalent modules such as module 58 shown in the upper lefthand area of FIG. 2, or wire equivalent modules such as module 60. Sockets 14a correspond to positions 14 of FIG. 1 and are adapted to receive plug-in wire equivalent modules, such as modules 62 and 64 illustrated in FIG. 2. It will be understood that modules 60, 62, and 64 are identical to one another and that module 60 is disposed in a socket 12a whereas modules 62 and 64 are disposed in sockets 14a. Sockets 16a are adapted to receive coil equivalent modules such as modules 66 and 68, shown in FIG. 2 to be connected into rung numbers three and four, respectively. Finally, sockets 18a are adapted to receive plug-in output converter modules, such as modules 70 and 72, in rung numbers three and four of FIG. 2.

Input converter module 56 includes screw terminals 73 and 74 so as to permit the module to be electrically interconnected with an external control device, such as a transducer controlled switch or the like. Each input converter module is capable of accepting ac or dc signals in the range of five to one-hundred twenty-five volts and includes photodiode isolation means to convert the input signal voltage to a low level logic signal, e.g., + 5 volts dc, of the type required to properly input a contact equivalent module, wire equivalent module, or coil equivalent mdoule as will be described in detail with reference to FIG. 4. In this fashion, an external switch may be effectively made a part of a rung circuit to control the series circuit conductivity thereof as desired. Each of the output converter modules 70 and 72 is provided with screw terminals 75 and 76 which permit the electrical interconnection of any rung in the ladder circuit to an external power consuming device, such as a motor or other relatively high-power requirement device. Each output converter module comprises means for photo-coupling the low-voltage logic signal applied thereto by the logic circuitry in the rung circuit to a solid-state relay comprising a Triac and a triggering circuit. Accordingly, the output converter modules may operate as interface devices between an external 120 -volt, 60-cycle power supply and the motors, solenoids, or other controlled load devices which are employed.

The arrangement of modules on the board 10a of FIG. 2 is chosen for random illustration only. It will be noted that rung number three illustrates the possibility of branching from normally opened contact equivalent module 58 into rung numbers two and four by way of wire equivalent modules 62 and 64. Wire 62 connects the contact equivalent module 58 into a normally closed contact equivalent module 78 whereas wire 64 connects the module 58 into a normally open contact equivalent module 80. To the righthand side of rung four an input converter 82 is shown connected to the output converter 72 by a single coil equivalent module 68 thereby to control the electrical condition of a contact equivalent module in one of the positions 12a on the board 10a.

Toward the bottom of the board 10a there is shown a power supply module 84, an input screw terminal pair 86 for receiving the 120-volt, 60-cycle line, an expander receptacle 88 to interconnect one board 10 with other boards, sockets 90 for receiving logic components hereinafter described with reference to FIG. 4, all of the modules being selectively connected and disconnected from the board 10a so as to reconfigure the board at will and to permit the storage of a plurality of such boards in a stacked or parallel relationship in a relatively small amount of space.

FIG. 4 — Schematic Circuit Diagram

The circuit diagram of FIG. 4 is similar in fundamental respects to the block diagram of FIG. 1 and like elements are identified with like reference characters. FIG. 4, however, discloses the schematic circuit details of the controller circuitry, the latch circuit, a coil equivalent module, the output converter, and various other areas of the overall system wiring arrangement.

FIG. 4 illustrates a plurality of contact equivalent modules 12b in positions 12, wire equivalent modules 14b in position 14, coil equivalent modules 16b in position 16, and the output converter modules 18b in positions 18. Looking at the contact equivalent module identified by the X–Y coordinate reference 1,1, the following combination of input and output signal lines are seen to exist:

X — The signal from the appropriate output line of X decoder 24 which operates as a half-select signal for any given contact equivalent module in the array during interrogation and update;

Y – The signal on the appropriate output line of the Y decoder 34 also operating as a half-select signal in determining the contact equivalent to be interrogated for possible update;

K — The status signal input of any contact equivalent module, connected to receive the L signal from the previous module in the same rung, either input converter, contact equivalent, or wire, except for the first or lefthandmost contact equivelent position 12 in the array where an unconnected K goes to 1, the conductive state, in FIG. 4;

L — The status output signal of any contact equivalent or wire equivalent module in a position 12, connected to the K input of the next module in the same rung, either contact equivalent, wire equivalent or coil equivalent as the case may be;

J — The update signal output from the coil equivalent during the update sequence, applied to and recognized by only the contact equivalent module in the position 12 selected by the X–Y decoders;

H — The signal that determines the contact configuration of the contact equivalent module and capable of being set equal to 0 for a normally closed contact equivalent or 1 for a normally open contact equivalent; operative only when the contact equivalent element is selected for interrogation;

$\overline{A}$ through $\overline{F}$ — The six signals which define the address or identification in binary coded octal of the coil equivalent which is the master with respect to the selected contact equivalent module generating the address, preset by two rotary code wheels or similar devices and effective only when the interrogation process is being carried out.

Describing now the controller circuitry, the clock 20 produces a one-hundred KHZ squarewave output which is applied to the four-bit binary counter 22 which controls the X or column drive. Three output signal lines from the counter 22 are connected into the column selection decoder 24 along with the clock signal by way of inverter 100. Decoder 24 generates low signal outputs in sequence from output number zero to output number seven, these signals being transferred through inverters 102 to the X drive input of the various positions 12 in the array. It should be observed that the X and Y drive signals are applied to the positions 12 in order even though those positions may not be occupied by a module. In a similar fashion, the four-bit counter 32 receives the output of the most significant bit position of counter 22 and has the output lines thereof connected into the decoder 34. The output lines of decoder 34 are connected through inverters 104 to the Y drive inputs of the position 12, a coincidence of X and Y being effective to select a position 12 for interrogation and update. As a position 12 is interrogated or selected, an address and normal status signal consisting of bits $\overline{A}$, $\overline{B}$, $\overline{C}$, $\overline{D}$, $\overline{E}$, $\overline{F}$, and H is generated in accordance with a preestablished setting on the contact equivalent module 12b itself and applied by way of lines 50 to the eight-bit bistable latch 48. The latch 48 includes output lines 51 over which the $\overline{A}$, $\overline{B}$, $\overline{C}$, and $\overline{D}$ signals are applied to the coil equivalent selection decoder 52. The $\overline{E}$ and $\overline{F}$ signals are logically combined in NAND gate 106 and applied to the G1 input of decoder 54. The output of the second of two series connected, one-shot multivibrators 46a and 46b is connected to the G2 input of decoder 52. The H signal on line 51 from latch 48 is connected through inverter 108 to produce a complement signal which is applied by way of line 110 to the coil equivalent modules 16b in the positions 16. The output of inverter 108 is connected through a second inverter 112 having an output line 114 which is also connected to the coil equivalent modules 16b as shown. The output lines 54 of decoder 52 which actually select the address coil equivalent modules include inverters 116 which are individually connected to the coil equivalent modules 16b in the various rungs as shown.

Looking now to the details of the coil equivalent module 16b in FIG. 4 the address select signal A$d$ from the decoder 54 is applied to one input of each of two three-input NAND gates 118 and 120. The L signal is applied to a second input of gate 118. This L signal is derived from the L output of the last element in the rung with coil equivalent 16b and is received on line 122 which is connected to one input of NAND gate 124. A second input P on line 126 is applied to NAND gate 124. P equal zero during power up for one complete interrogation cycle. This sets all contact equivalents to the deenergized state. A light emitting diode 125 indicates when the coil equivalent is in the energized state. The logically combined combination of L and P is applied from the output of gate 124 to the input of NAND gate 128 and thence to the L input of gate 118. Assuming P equals zero, the complement of L is applied directly to a second input of gate 120, the two gates 118 and 120 being effective to determine whether or not an update signal is to be generated in accordance with the truth table of FIG. 9.

The H signal representing the normal configuration of the contact equivalent module 12b being interrogated is applied as a third input to gate 120 and the complement of H or H is applied as a third input to gate 118. The outputs of the two gates 118 and 120 are tied together giving the wired AND function shown by gate 130, the output of which represents the J signal. The truth table for gates 118 and 120 in the wired AND is:

|              | A | H | L | J |
|--------------|---|---|---|---|
| N.O.         | 1 | 1 | 1 | 1 |
|              | 1 | 1 | 0 | 0 |
| N.C.         | 1 | 0 | 1 | 0 |
|              | 1 | 0 | 0 | 1 |
| NOT SELECTED | 0 | X | X | 1 |

A J bus drive is obtained by connecting the J signal through the series combination of inverters 132 and 134, the output of inverter 134 being connected directly to the J bus 136 which runs to each of the rungs as shown. In addition, each coil equivalent includes a second series of inverters 138 and 140 operating as a rung drive amplifier to ensure that adequate power is available in the rung to which the J signal is applied. As will hereinafter be made apparent with reference to the schematic diagram of FIG. 5, the J signal is applied to every position 12 in the array whenever it is generated. It is, however, used to effect a condition change only in the contact equivalent module 12b where the X and Y signals high are simultaneously or coincident applied. Accordingly, the output of inverter 140 is connected directly to the J input of each of the contact equivalent positions 12 in a given rung.

Figures 8, 9:
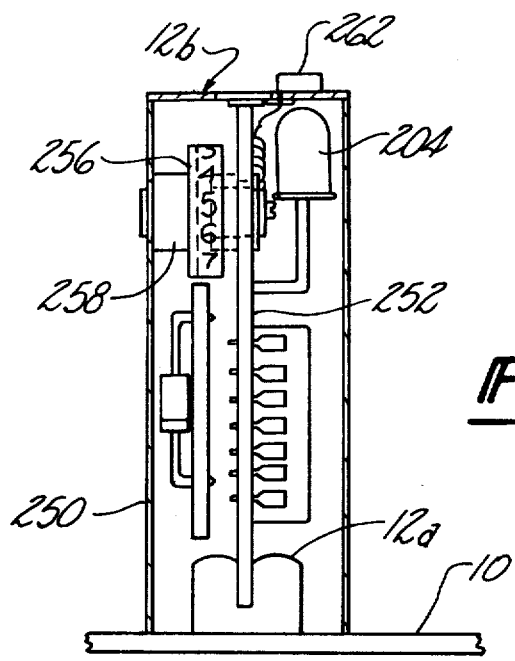
FIG. 8 is a cross sectional view with parts broken away of the illustrative plug-in modular device for use in combination with the panel of FIG. 2; and, FIG. 9 is a table of fundamental relationships useful in describing the operation of the devices in the circuit diagram of FIG. 4.

As shown in FIG. 9, if the contact equivalent module is of the normally closed contact type (H = 0) and the L signal for the rung in which the master coil equivalent module resides is 0, the master coil module 16b is deenergized (nonconducting) and a signal J = 1 is produced indicating that the contact equivalent module should be in the conducting state. If, however, the L signal for the rung within which the master coil equivalent resides is equal to 1, then the coil is energized to open the contacts and, accordingly, the J signal must be low or 0. If the contact equivalent is of the normally open type ($H = 1$) and the coil equivalent is deenergized ($L = 0$), then the contact equivalent module 12b must be nonconductive and, accordingly, the J signal is low. For the same contact equivalent the $L = 1$ condition represents an energized master coil equivalent placing the contact equivalent in the conducting stage. Therefore, the J signal is high or 1 for that condition.

Discussing the remaining details of FIG. 4, it can be seen that the 120-volt ac input or line voltage is connected to a zero crossing detector 150 having an output connected through NAND gate 152 and D-type flip-flop 154 to the input of the output converter module 18b in the rung which is controlled by the coil equivalent module 16b. Gate 152 also receives the L signal indicating that the rung within which the coil equivalent module and the output converter module are located is energized and, hence, conductive. Under these conditions, it is, of course, necessary to render the load device to which the output converter is connected energized so as to perform in exactly the same fashion as would a hardwired relay circuit containing the series combination of contacts, coils, and load. The zero crossing detector 150 ensures that the load is energized near zero voltage regardless of the point in time at which the L signal goes high at the output of gate 128.

The output converter modules 18b are shown to comprise a photo coupler 158 connected to receive the output signal on line 156 from flip-flop 154 and a trigger circuit 160 which is adapted to fire the Triac 162 to provide a conductive path between the line voltage terminal 164 and the load terminal 166. Accordingly, an output converter module 18b effectively extends the continuous electrical rung circuit in which it is located and provides the interface necessary to go from low-voltage logic devices to external devices of greater power requirement.

Figure 5:
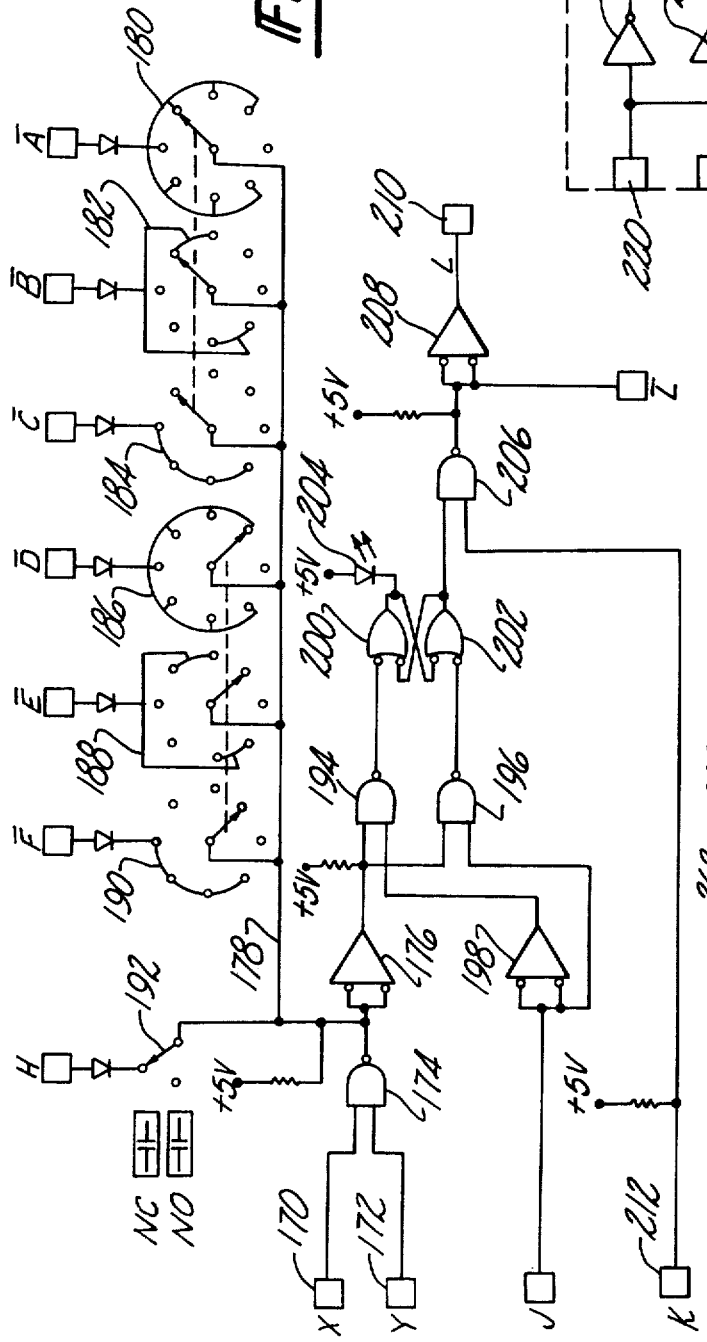
FIG. 5 is a schematic circuit diagram of a modular device used in the illustrative embodiment of the invention to represent relay contacts.

FIG. 5 — Schematic Diagram of Contact Equivalent

Looking now to FIG. 5, a schematic diagram of a contact equivalent module 12b is shown. It will be observed that the previously described letter convention for X, Y, J, K, $\bar{A}, \bar{B}, \bar{C}, \bar{D}, \bar{E}, \bar{F}$, H, and L is followed. Accordingly, it is a straightforward matter to substitute the schematic circuitry of FIG. 5 into a block 12b in FIG. 4 to determine the exact manner in which a contact equivalent is connected into a continuous rung circuit. The X and Y inputs 170 and 172 are logically combined in NAND gate 174 and applied to the input of inverter 176. The output of inverter 176 goes high only if both the X and Y signals are high. The output of gate 174 is connected by way of line 178 to the $\bar{A}, \bar{B}, \bar{C}, \bar{D}, \bar{E}, \bar{F}$, and H address identification means of which the "units" encoder includes rotary contact devices 180, 182, and 184 having gang connected wipers and the "eights" encoder includes rotary contact wheels 186, 188, and 190 also having gang connected wipers. The wipers are commonly connected to the signal line 178 along with the wiper 192 of the H encoder switch. All of the contact devices themselves 180, 182, 184, 186, 188, and 190 and the wiper 192 of the H switch are connected through diodes to the respective address signal lines which appear in the circuitry of FIG. 4. Accordingly, when line 178 goes low indicating that the contact equivalent module represented by FIG. 5 has been selected, the address represented by signals $\bar{A}$ through $\bar{F}$ is sent out to select the coil equivalent module 18b to which this contact equivalent module is slaved. In addition, the H signal representing the normally open or normally closed circuit configuration of the particular contact equivalent module is also forwarded to the logic circuitry, including gates 118 and 120 in the selected or addressed coil equivalent module.

The output of inverter 176 is connected to one input of each of gates 194 and 196. In addition, the J signal is connected to the other input of gate 196 and the complement of J, ($\bar{J}$) is produced by inverter 198 and connected to the other input of gate 194. Gates 194 and 196 are connected to respective gates 200 and 202, the outputs of which are cross connected back to the input as shown such that the gates define a flip-flop. It can be seen that $J = 0$ places the flip-flop in the condition where the output of gate 202 is low, whereas $J = 1$ renders the output of gate 202 high. It can also be seen that the J signal has no effect unless the coincidence of X and Y occurs thereby to render the output of gate 176 high. As shown in FIG. 5, the output of gate 200 is preferably connected to a light emitting diode indicator 204 so as to produce a visual output whenever the contact equivalent module is in the conductive state.

The output of gate 202 is connected to one input of gate 206, the other input being connected to receive the K signal from the previous element in the rung. Therefore, gate 206 is only enabled whenever a $K = 1$ signal is provided by the previous element in the continuous rung circuit. The output of gate 206 is connected through inverter 208 to the L signal terminal 210 which in turn is connected to the K terminal 212 of the next element or module in the rung. In this fashion, the modules in the rung are caused to operate exactly as would a hardwired serial relay circuit.

Figure 6:
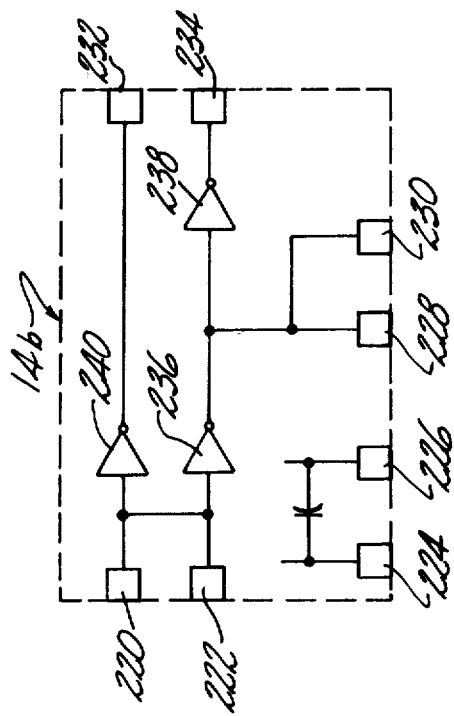
FIG. 6 is a schematic diagram of a modular device used in the illustrative embodiment to represent a passive conductor or wire.

FIG. 6 — Schematic Diagram of Wire Equivalent Module

In FIG. 6, a representative wire equivalent module 14b is shown to include terminals 220, 222, 224, 226, 228, 230, 232, and 234, these terminals typically being arranged as edge contacts on a plug-in circuit board adapted to be received by the sockets 12a and 14a in the panel of FIG. 2. A wire equivalent module may be plugged into a socket 12a whenever a wire is needed for electrical continuity between one or more elements in a given rung and, in addition, a wire equivalent may be plugged into a socket 14a to accomplish an "OR" or a branch. The term OR is used to indicate that two or more rungs are brought together for common application to the continuation of one of those rungs. The term "branch" is used to indicate that a given rung circuit branches off at some point into two or more rungs to be continued from left to right according to the convention observed in the panel 10 of FIGS. 1 and 2. Both branches and OR circuits are accomplished by aligning the long dimension of a wire equivalent module 14b with the column or vertical axis of the panel 10. The term "continuation" is used to simply indicate that the wire equivalent module is put into a socket position 12 to represent a passive wire or conductor. The continuation is accomplished by aligning the long dimension of a module 14b with the rung or horizontal panel axis. The sockets 12a may be keyed or the module housing conspicuously marked to prevent the wire modules from being inserted in sockets 12b upside down.

Whenever the wire equivalent module 14b is connected as shown in FIG. 2 into a contact equivalent position as a mere continuation, terminal 222 is connected to the K position of FIG. 1 and terminal 234 is connected to the L position. Inverters 236 and 238 effectively pass the L output of a previous module to the K input of a subsequent module unchanged. In this position the X and Y selection signals have no function. In a wire equivalent socket 14a, module 14b may be connected pointed "north" or "south" on the panel 10, pins have been selected for operation in either case. To connect a lower rung to a higher rung, terminal 222 is connected to the L̄ signal position of the contact equivalent position above and to the left and terminal 220 is connected to the L̄ position of the contact equivalent below and to the left. These two terminals are tied together as shown. Terminal 230 produces the L signal to be connected to the K input of the next position in the rung being connected into. The terminal 232 is connected commonly with the L signal from that output of the last position in the rung from which the connection is made, the path between terminals 220 and 232 including the inverter 240. Thus, module 14b can provide an ORed L signal at terminal 232 should the rung from which the connection is made be extended to the right. Terminals 224 and 226 are always connected to +5 volts and ground.

Figure 7:
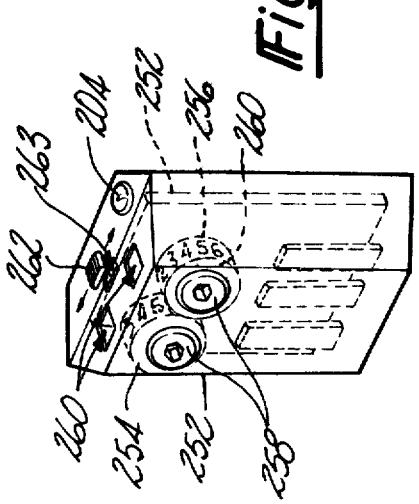
FIG. 7 is a drawing of a modular device illustrating the geometric configuration and interior arrangement thereof.

FIGS. 7 & 8 — Illustrative Contact Equivalent Module

Looking now to FIGS. 7 and 8, an illustrative embodiment of an actual contact equivalent module 12b is shown. Module 12a comprises a case or housing 250 of molded plastic or the like supporting therein a circuit board 252 having edge mounted contacts for engagement with a socket 12a which is part of the terminal board 10 as previously described. The address selection means comprises the gang connected rotary contact octal encoded wheels 254 and 256 which are accessible by means of recessed Allen-head bolts 258 having the axes of rotation thereof normal to the front of the housing 250. Accordingly, the address or coil equivalent designation for each contact equivalent module is set manually. Apertures 260 are provided in the top of the housing 250 to enable the code numbers on the edges of the wheels 254 and 256 to be viewed. A laterally movable switch 262 is provided on top of the housing to provide for the setting of the H signal to represent either a normally closed or normally opened contact equivalent. Setting switch 262 also moves a ladder diagram symbol (normally open or normally closed contacts) under a viewing aperture 263 so the preset configuration can be seen. These symbols display the ladder diagram of the system when all the modules are in place. The working system can then be photographed to simplify documentation. Finally, a light emitting diode-type indicator 204 is disposed within the housing 250 so as to provide an indication whenever the contact equivalent 12b represents a conductive circuit component. This facilitates troubleshooting in an actual circuit connection by indicating when the various elements in any given rung are in the conductive state.

The shape of the module 12b is considered to be of significance in the implementation of the invention as it gives rise to the interfitting relationships indicated in FIG. 2 where various modules are interconnected in a branching mode. Moreover, the polygonal plan view with one elongated dimension clearly indicates the orientation of the module 12b relative to the panel 10, such orientation having functional significance both in terms of contact mating and graphic information conveyance as previously described. It is, however, to be understood that various other configurations including shapes may be used and that the shape, size, and internal configuration is not considered to be critical for the purposes of the present invention.

SUMMARY

From the foregoing description, it is apparent that the present invention provides an apparatus for the systematic and simplfied construction of complex as well as simple control circuits having relay circuit characteristics. Moreover, it is apparent that the implementation or construction of even a fairly complex circuit may be carried out without a knowledge of Boolean arithmetic and without the usual problems and disadvantages of hardwired circuit components. The construction step is carried out simply by selecting the proper modules and plugging the modules into the panel 10 in the proper configuration. Once selects input converter modules at the beginning of the rungs where switches and other input devices are to be employed and one further selects output converter modules at the end of those rungs where an external device is to be controlled. Wiring between the external devices including switches, transducers, motors, and the like is easily accomplished by means of the screw terminals provided on the input and output converter modules themselves. The functional relationship or master-slave relationship between coil equivalent modules and contact equivalent modules is accomplished by fixing the output lines 54 from decoder 52 with given address position correlations and selecting the setting of the wheels 254 and 256 of the contact equivalents to correspond with those addresses on a selective basis before they are plugged into the panel 10. By this simple facility, the master-slave relationship is established and the contact equivalent modules are thereafter maintained by the update signals in the proper condition, either conductive or nonconductive, in accordance with the current-carrying or noncurrentcarrying state of the coil equivalent modules to which they are slaved. Accordingly, the logic portion of the circuit functions exactly in the same fashion as a hardwired, nonsolidstate relay circuit while providing all of the advantages of space conservation and ease of assembly and disassembly inherent in plug-in logic devices. Although the invention has been described with reference to a specific embodiment, it is to be understood that various modifications in the arrangements disclosed herein are possible and will be apparent to those skilled in the art. The foregoing description is, thus, to be construed as illustrative rather than limiting in character.

The embodiments of the invention in which an exclusive property or privilege is claimed are defined as follows:

1. Apparatus for constructing relay-type control circuit equivalents comprising: at least a first solid-state, logic-level modular device representing a relay coil in circuit response; at least a second solid-state, logic level modular device representing relay contacts in circuit response; a prewired panel having terminal means for receiving said modular devices in selected patterns to establish continuous electrical circuits therethrough; input means for interfacing external signal devices, such as switches, with said modular devices so as to operatively connect said external signal devices in said continuous electrical circuits; output means for interfacing external power consuming devices with said modular devices so as to operatively connect said power consuming devices in said continuous electrical circuits whereby the conductive or nonconductive state of a given one of said continuous electrical circuits controls the application of power to a power consuming device, and controller means for selectively interconnecting first and second modular devices in said panel to provide a periodically updated master-slave relationship therebetween whereby the conductive state of contact equivalents in a given continuous electrical circuit may be controlled by the coil equivalent in another continuous electrical circuit.

2. Apparatus as defined in claim 1 wherein said controller means includes clocked means for sequentially and cyclically selecting said second modular devices in said panel for updating the status thereof according to the conductive states of the first modular devices to which second modular devices are slaved.

3. Apparatus as defined in claim 2 wherein the terminal means of said panel are arranged in a two-dimensional array of positions defining columns and rungs, the continuous electrical circuits extending along said rungs in the manner of a ladder circuit diagram.

4. Apparatus as defined in claim 3 wherein said clocked means includes first selection means for applying selecting signal quantities to the terminals of said columns in sequence, and second selection means for applying selecting signal quantities to the terminals of said rungs in sequence, said modular devices including logic gate means responsive only to a coincidence of column and rung selection signal quantities for updating the status thereof.

5. Apparatus as defined in claim 4 including address signal generating means associated with each of said second modular devices for generating an address signal upon receipt of said coincidence of signal quantities; said controller means including address signal decoder means connected via said panel to receive said address signals from said second modular devices as selected and to interrogate the first modular devices according to the address signals.

6. Apparatus as defined in claim 5 wherein each of the second modular devices includes contact configuration signal means capable of being set in first and second conditions to generate status signals representing normally open and normally closed contact states, respectively.

7. Apparatus as defined in claim 6 wherein each of said second modular devices includes means for producing a status signal capable of selectively representing conductive and nonconductive conditions in the continuous electrical circuit of which the modular device is a part, said prewired panel including means for connecting the status signal of a second modular device in said panel to the next device in the same rung thereby to indicate the conductivity of the continuous electrical circuit represented by said rung.

8. Apparatus as defined in claim 7 wherein each of the first modular devices includes logic means connected to receive the status signal from second devices in the same rung and the contact configuration signal from the selected second device, said logic means being responsive to the logical content of said signals to produce an update signal representing the required conductivity state of said selected second device, and means for connecting the update signal to the said selected second device.

9. Apparatus as defined in claim 8 including gate means in each of said second devices for receiving the column and rung selection signals and the update signals and responsive to a coincidence thereof to affect the state of the second device receiving such signals.

10. Apparatus as defined in claim 9 including as part of said panel an update signal bus, and individual rung driver amplifier means connected between said bus and the rungs of said panel to conduct update signals to the second devices in the panel.

11. Apparatus as defined in claim 1 wherein said panel comprises a two dimensional support surface, a plurality of first terminal sockets disposed over the panel and arranged in columns and rungs, conductor means extending along said rungs and between said sockets whereby said continuous electrical circuits extend along said rungs, said continuous electrical circuits being continuously conductive only when and to the extent conductive second modular devices are disposed in said sockets, said panel including a plurality of second terminal sockets arranged mediate said first sockets for providing connections between rungs.

12. Apparatus as defined in claim 11 including at least a third solid-state modular device representing a wire in circuit response.

13. Apparatus as defined in claim 12 wherein the controller means includes periodically operative selection circuit means connected only to said first sockets for providing said relationship.

14. Apparatus as defined in claim 11 wherein said input means comprises at least one fourth modular device having a pair of externally accessible terminals to receive an external signal device, and electrical coupling means for connecting the electrical signal quantities into said electrical circuits, all of said second, third, and fourth modular devices being electrically compatible with said first sockets in the panel.

15. Apparatus as defined in claim 14 wherein said output means comprises at least one fifth modular device having a pair of externally accessible terminals to provide connection to an external power consuming device, and electrical coupling means for converting logic level signals from said electrical circuits to circuit closures between said power consuming device and a relatively high voltage supply, said panel having a column of third sockets in said rungs for receiving only said fifth modular devices.

16. Apparatus as defined in claim 15 wherein said panel includes a column of fourth sockets in said rungs for receiving only said first modular devices.

17. Apparatus as defined in claim 16 wherein the columns of third and fourth sockets are adjacent.

18. A plug-in circuit panel comprising a two dimensional array of first terminal sockets arranged in columns and rungs, first conductor means on said panel for providing normally discontinuous conductive paths between sockets in the same rung, a two dimensional array of second terminal sockets arranged mediate said first sockets and in a discrete orientation, second conductor means on said panel for providing normally discontinuous conductive paths between adjacent rungs at points between columns, and at least one column of third terminal sockets separate from said first sockets and arranged in said rungs, said first conductor means extending between said first sockets and respective third sockets in the same rungs.

19. Apparatus as defined in claim 18 further including a plurality of solid-state, plug-in modular devices representing relay contacts, said devices having contact means insertable in said first sockets for selectively completing said circuit paths along said rungs.

20. Apparatus as defined in claim 18 further including a plurality of solid-state, modular devices representing relay coils, said devices having contact means insertable in said third sockets for continuing said circuit paths along said rungs from the first sockets.

21. Apparatus as defined in claim 18 further including a plurality of solid state, plug-in modular devices representing wires, said devices having contact means insertable in said first and second sockets for selectively completing electrical circuit paths along and between said rungs.

22. Apparatus as defined in claim 18 further including a plurality of solid-state, plug-in modular devices for providing interfacing between switches and logic circuit components, said devices having contact means insertable in said first sockets for initiating an electrical circuit along a rung at any point in said array of first sockets.

23. Apparatus as defined in claim 18 wherein said panel further includes a plurality of fourth terminal sockets arranged in a column adjacent and parallel to said column of third sockets but separate therefrom, and a plurality of output converter modules having first terminal means insertable into said fourth sockets, said output converter modules including second terminals for connection to an external load device, and trigger means for controlling the conductivity of the electrical circuit between said second terminal means in accordance with the conductivity of the continuous electrical circuits extending along the rungs of the panel and including the output converter modular devices.

* * * * *